(12) United States Patent
Martin et al.

(10) Patent No.: US 7,907,410 B2
(45) Date of Patent: Mar. 15, 2011

(54) UNIVERSAL PATTERNED METAL THERMAL INTERFACE

(75) Inventors: Yves C. Martin, Ossining, NY (US); Theodore G. Van Kessel, Millbrook, NY (US)

(73) Assignee: International Business Machines Corporation, Armonk, NY (US)

( * ) Notice: Subject to any disclaimer, the term of this patent is extended or adjusted under 35 U.S.C. 154(b) by 59 days.

(21) Appl. No.: 11/936,887

(22) Filed: Nov. 8, 2007

(65) Prior Publication Data

US 2009/0122491 A1      May 14, 2009

(51) Int. Cl.
*H05K 7/20* (2006.01)

(52) U.S. Cl. .............. 361/708; 361/679.54; 361/704; 361/705; 361/707; 361/718; 165/80.2; 165/185

(58) Field of Classification Search .......... 361/704–705, 361/707–708; 165/80.2–80.3, 185
See application file for complete search history.

(56) References Cited

U.S. PATENT DOCUMENTS

| | | | | |
|---|---|---|---|---|
| 4,151,547 A * | 4/1979 | Rhoades et al. | ............... | 257/718 |
| 4,233,645 A * | 11/1980 | Balderes et al. | ............... | 361/698 |
| 4,654,754 A * | 3/1987 | Daszkowski | ............... | 361/708 |
| 4,838,347 A * | 6/1989 | Dentini et al. | ............... | 165/185 |
| 5,161,090 A * | 11/1992 | Crawford et al. | ............... | 361/700 |
| 5,323,294 A * | 6/1994 | Layton et al. | ............... | 361/699 |
| 5,729,052 A * | 3/1998 | Tonti et al. | ............... | 257/712 |
| 5,783,862 A * | 7/1998 | Deeney | ............... | 257/714 |
| 7,063,127 B2 * | 6/2006 | Gelorme et al. | ............... | 165/80.2 |
| 7,200,006 B2 * | 4/2007 | Farrow et al. | ............... | 361/704 |
| 7,306,847 B2 * | 12/2007 | Capp et al. | ............... | 428/408 |
| 7,360,581 B2 * | 4/2008 | Tuma et al. | ............... | 165/80.3 |
| 7,482,197 B2 * | 1/2009 | Furman et al. | ............... | 438/106 |
| 7,593,228 B2 * | 9/2009 | Jarrett et al. | ............... | 361/704 |
| 7,694,719 B2 * | 4/2010 | Furman et al. | ............... | 165/80.3 |
| 2003/0112603 A1 * | 6/2003 | Roesner et al. | ............... | 361/719 |
| 2005/0068738 A1 * | 3/2005 | Kim et al. | ............... | 361/704 |
| 2006/0171124 A1 * | 8/2006 | Capp et al. | ............... | 361/705 |
| 2007/0102140 A1 * | 5/2007 | Tuma et al. | ............... | 165/80.3 |
| 2007/0238282 A1 * | 10/2007 | Furman et al. | ............... | 438/612 |
| 2008/0165502 A1 * | 7/2008 | Furman et al. | ............... | 361/709 |
| 2010/0147497 A1 * | 6/2010 | Furman et al. | ............... | 165/133 |

\* cited by examiner

*Primary Examiner* — Robert J Hoffberg

(57) ABSTRACT

The present invention is a universal patterned metal thermal interface. The thermal interface eliminates the need for surface processing of one or both contact surfaces that are to accommodate the thermal interface. In one embodiment, a thermal interface for coupling a first solid to a second solid includes a patterned metal insert, a corrosion resistant layer coating at least one exterior side of the insert, for protecting the insert from corrosion, and an organic layer coating the corrosion resistant layer, for facilitating bonding of the insert to one of the first solid or the second solid.

15 Claims, 3 Drawing Sheets

UNIVERSAL PATTERNED METAL THERMAL INTERFACE

FIELD OF THE INVENTION

The present invention relates generally to microprocessor and integrated circuits, and relates more particularly to the cooling of integrated circuit (IC) chips.

BACKGROUND OF THE INVENTION

Recent years have seen an evolution toward higher-power microprocessor, graphics, communication and memory semiconductor chips. This evolution in turn has driven interest in highly conductive metal thermal interface (MTI) materials to provide thermal coupling between chips and heat sinks. Typical MTIs have been shown to function best when they adhere sufficiently both to the semiconductor substrate of the chip and to the material of the heat sink.

Thus, there is a need for a universal metal thermal interface that provides good thermal coupling between a chip and a heat sink.

SUMMARY OF THE INVENTION

The present invention is a universal patterned metal thermal interface. The thermal interface eliminates the need for surface processing of one or both contact surfaces that are to accommodate the thermal interface. In one embodiment, a thermal interface for coupling a first solid (e.g., a heat generating device) to a second solid (e.g., a heat sink) includes a patterned metal insert, a corrosion resistant layer coating at least one exterior side of the insert, for protecting the insert from corrosion, and an organic layer coating the corrosion resistant layer, for facilitating bonding of the insert to one of the first solid or the second solid. Patterning refers to an arrangement of local thick and thin spots on an otherwise smooth foil or sheet of metal interface material. Many patterns are possible, and the precise distribution of thick and thin spots is chosen based on the application to give statistical uniformity. The patterned surface of the thermal interface allows the thermal interface to deform under compression between the heat sink and the heat generating device, leading to better conformity of the contact points of the thermal interface to the surfaces of the heat sink and the heat generating device.

The size and distribution of the thick and thin spots in the patterning is selected to account for the bow, warp and other surface properties of the heat generating device and of the heat sink. For instance, in an exemplary embodiment, the relative thickness between the thick and thin spots on the patterned thermal interface is 150 micron, with 200 micron pitch in a rectangular periodic array for an expected heat sink warping of approximately fifty micrometers.

During compression of the thermal interface (e.g., between a heat-generating device and a heat sink) the surface patterning of the thermal interface allows for local high pressure points uniformly distributed over the surface to be thermally coupled. This pressure causes the soft metal to creep and conform microscopically to the surfaces being thermally coupled, thereby providing good thermal contact at these points. Thermal coupling is further enhanced by the breakup of surface oxides, allowing metallic bonds to form at contact points between the metal interface material and the metal of the surfaces being thermally coupled. In one embodiment, moderate heat (e.g., not in excess of the thermal interface's melting point) is applied to accelerate the creep process. Embodiments of the invention intend that the thermal interface metal remain in solid phase during application and use.

Since most heat sinks are clamped to heat-generating devices with significant pressure (e.g., 20 pounds per square inch or more) in order to compress thermal greases, the patterned metal thermal interface provides a practical high performance alternative with little or no change to existing assemblies. Pressure and optional heating are present during the application of the patterned metal interface. Once the thermal interface has been applied and bonded to the heat-generating device and to the heat sink, optional maintenance of pressure leads to better mechanical stability and robustness of the assembly.

The patterned metal thermal interface is intended as a general thermal interface solution. One particular area in which the thermal interface of the present invention may find use is between a computer chip comprised of silicon (and typically coated with silicon dioxide or silicon nitride) and a heat sink comprised of copper, nickel-plated copper, or aluminum. A second area in which the thermal interface of the present invention may find use is between a lidded computer chip and a heat sink (similar to the heat sink described above), where the lid of the computer chip is comprised of copper or nickel-plated copper. Thus, the mating surfaces to be thermally coupled will, in many cases, be comprised of copper, aluminum, nickel, or silicon. In one embodiment, where the patterned metal thermal interface is comprised of indium or tin, the thermal interface can be directly applied to copper, nickel and silicon surfaces. In another embodiment, where the patterned metal thermal interface is used with a silicon surface, a surface metallization is optionally applied to promote bonding and improve the thermal contact performance. If pressure is maintained during use, surface metallization of the thermal interface is not absolutely necessary, but will improve the thermal performance and reduce corrosion susceptibility.

An important aspect of corrosion immunity is that the patterned metal of the thermal interface be sandwiched between more noble, less corrosive metals (e.g., oxide-free copper or nickel surfaces). Embodiments of the present invention provide for a corrosion-resistant patterned metal thermal interface that can be inserted between any two metals and/or insulators by coating one or both surfaces of the patterned metal with a thin layer of a more noble or corrosion resistant material. Applications that may benefit from such a thermal interface include those involving silicon, silicon dioxide, or silicon nitride materials, such as those commonly found on microprocessor chip surfaces.

In addition to the thermal advantages of using the patterned metal thermal interface, there are advantages in rework. One of the most common thermal interface materials in use today is thermal grease. Thermal grease comprises oil containing thermally conductive particles. Thermal grease is extremely messy and difficult to clean during rework. The patterned metal thermal interface, by contrast, is dry and convenient to remove during rework by simply separating the heat sink from the heat-generating device and peeling or lightly scraping the patterned metal thermal interface off of the coupled surfaces.

Moreover, because the coating of the corrosion resistant layer and the organic layer make the patterned metal thermal interface "universal", in that the patterned metal thermal interface may be deployed to couple any two solids (such as a heat generating device and a heat sink) without requiring substantial preparation or conditioning of the solids.

BRIEF DESCRIPTION OF THE DRAWINGS

So that the manner in which the above recited embodiments of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION

In one embodiment, the present invention is a thermal interface for use in dissipating heat from heat-generating devices (e.g., microprocessor chips). Embodiments of the present invention provide improved heat transfer from a heat generating device to a heat sink, thereby allowing for better heat dissipation from the heat generating device. This ultimately results in better performance of the heat generating device, as heat-related failures are minimized. Although embodiments of the present invention will be described within the context of heat generating devices and heat sinks, those skilled in the art will appreciate that the thermal interface described herein is universal in that it may be used to facilitate thermal contact between any two solid materials or surfaces, without requiring prior processing or alteration of the surfaces (e.g., beyond cleaning).

Figure 1:
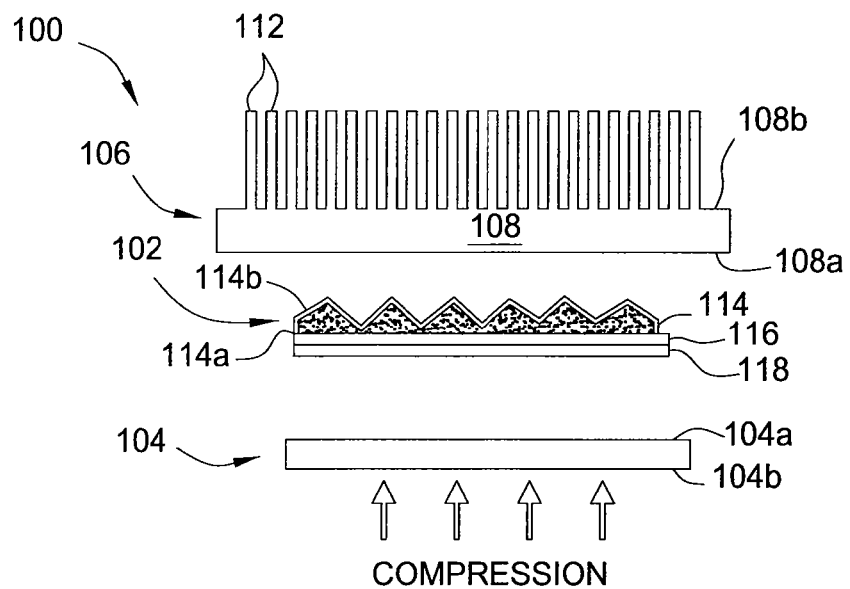
FIG. 1 is an exploded view of a heat sink assembly using a patterned metal thermal interface, according to a first embodiment of the present invention.

FIG. 1 is an exploded view of a heat sink assembly 100 using a patterned metal thermal interface 102, according to a first embodiment of the present invention. As illustrated, the heat sink assembly 100 comprises the thermal interface 102 disposed between a heat generating device 104 (e.g., a microprocessor chip or a lidded chip) and a heat sink 106. Alternatively, the heat sink 106 may be a lid where the heat generating device 104 is a microprocessor or semiconductor chip.

The heat sink 106 comprises a base 108 having first surface 108a and a second surface 108b. In one embodiment, the heat sink 106 comprises at least one of: a vapor chamber, a heat pipe or a liquid cooler. The first surface 108a of the base 108 is relatively flat and is configured to contact the thermal interface 102. In one embodiment, the second surface 108b of the base 108 is also relatively flat and comprises a plurality of fins 112 coupled thereto. The fins 112 are positioned in a substantially perpendicular orientation relative to the base 108.

The heat generating device 104 also comprises a first surface 104a and a second surface 104b. In one embodiment, both the first surface 104a and the second surface 104b of the heat generating device 104 are relatively flat. In one embodiment, the heat generating device 104 is a silicon microprocessor chip.

The thermal interface 102 comprises an insert 114, a corrosion resistant layer 116, and an organic layer 118. The insert 114 has a relatively smooth first side 114a (i.e., the local topography of the first side 114a does not exceed approximately one-tenth the insert thickness) and a patterned second side 114b. In one embodiment, the insert 114 comprises a metal foil, a metal mesh or a perforated metal sheet. The metal of the insert 114 is a solid metal (i.e., solid in phase). The insert 114 is comprised of a relatively soft metal that deforms readily under moderate pressure. In one embodiment, the insert 114 is comprised of at least one of: indium, tin, indium-tin, lead, gold, silver, bismuth, antimony, thallium or gallium. In another embodiment, the insert 114 is comprised of a soft metal mesh. In another embodiment, the insert 114 is comprised of an array of metal lumps held together using an organic binder. As discussed above, the second side 114b of the insert 114 is patterned or textured; that is, the second side 114b of the insert 114 exhibits a substantially uniform thickness and smoothness but with local topography (high and low spots). In a further embodiment, the insert 114 has a thickness of approximately 150 microns.

The corrosion resistant layer 116 comprises a layer of corrosion-resistant material coating the first side 114a of the insert 114. In one embodiment, the corrosion-resistant material is at least one of: titanium, tantalum, tungsten, nickel, gold, or platinum.

The organic layer 118 comprises a layer of organic material coating the corrosion resistant layer 116. In one embodiment, the organic layer 118 comprises at least one of: an adhesive (e.g., epoxy), a polymer, an oil, a wax, or a paraffin.

During assembly of the heat generating device 104 to heat sink 106, the thermal interface 102 (i.e., the insert 114, corrosion resistant layer 116, and organic layer 118) is compressed between the heat generating device 104 and the heat sink 106. The patterned second surface 114b of the insert 114 deforms against the heat sink 106 and forms a thin metallic bond or alloy between the soft metal of the insert 114 and the metal (e.g., copper) heat sink 106. Simultaneously, the organic layer 118 forms a thin bond between the heat generating device 104 and the metallic corrosion resistant later 116. The patterned second surface 114b of the insert 114 acts locally as a deformable cushion that distributes the applied pressure evenly, even if the surfaces of the heat generating device 104 or the heat sink 106 are not perfectly flat.

Resistance to corrosion is achieved on both sides of the thermal interface 102. On the relatively smooth first side 114a of the insert 114, corrosion resistance is achieved via the metallic bonding to the corrosion resistant layer 116. On the patterned second side 114b of the insert 114, corrosion resistance is achieved via inter-metallic bonding with the metal heat sink. Curing of the thin organic layer 118 can occur over time and/or with applied heat. The thermal interface 102 therefore provides for a mechanically stable heat sink assembly 100 and a reliable bond to the surface of the heat generating device 104.

In one embodiment, the materials and thicknesses for the corrosion resistant layer 116 and the organic layer 118 are chosen such that: (1) the organic layer 118 substantially adheres to the first surface 104a of the heat generating device 104; (2) the organic layer 118 substantially isolates first surface 104a of the heat generating device 104 from chemical interaction; (3) the corrosion resistant layer 116 substantially prevents oxide formation on the insert 114; (6) the corrosion resistant layer 116 substantially adheres to the organic layer 118; and (7) the corrosion resistant layer 116 is substantially flexible and bonds to the insert 114. The respective thicknesses of the organic layer 118 and the corrosion resistant layer 116 are chosen with knowledge of the deposition process (e.g., sputtering, evaporation, jet process, etc.) to provide adhesion, coverage and low film stress. In one embodiment, the thickness of the organic layer 118 is between approximately ten and one hundred nm, and the thickness of the corrosion resistant layer 116 is between approximately fifty and one hundred nm.

In order for intermetallic bonding with the soft metal of the insert 114 to occur properly, the first surface 108a of the base 108 of the heat sink 106 needs to be substantially free of oxides and contaminants. In one embodiment, oxides and contaminants can be removed by surface conditioning shortly prior to assembly.

Figure 2:
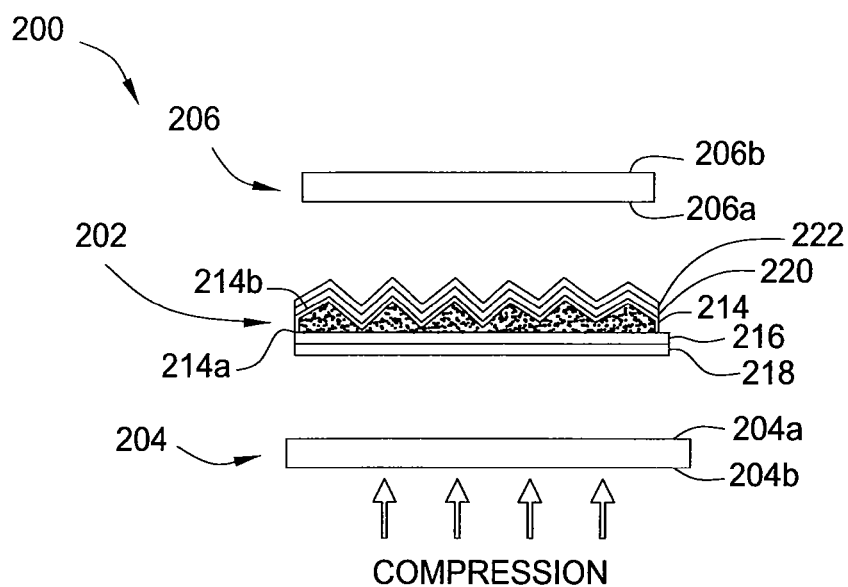
FIG. 2 is an exploded view of a heat sink assembly using a patterned metal thermal interface, according to a second embodiment of the present invention.

FIG. 2 is an exploded view of a heat sink assembly 200 using a patterned metal thermal interface 202, according to a second embodiment of the present invention. Specifically, the thermal interface 202 illustrated in FIG. 2 alleviates some of the manufacturing constraints associated with conditioning a heat sink to remove oxides and contaminants (i.e., substantially without the need to condition or otherwise treat the heat sink).

The heat sink assembly 200 is substantially similar to the heat sink assembly 100 illustrated in FIG. 1 and comprises the thermal interface 202 disposed between a heat generating device 204 (e.g., a microprocessor chip or a lidded chip) and a heat sink 206. Alternatively, the heat sink 206 may be a lid where the heat generating device 204 is a microprocessor or semiconductor chip.

The heat sink 206 comprises at least a first surface 206a and a second surface 206b. In one embodiment, the heat sink 206 comprises at least one of: a vapor chamber, a heat pipe or a liquid cooler. The first surface 206a of the heat sink 206 is relatively flat and is configured to contact the thermal interface 202.

The heat generating device 204 also comprises a first surface 204a and a second surface 204b. In one embodiment, both the first surface 204a and the second surface 204b of the heat generating device 204 are relatively flat. In one embodiment, the heat generating device 204 is a silicon microprocessor chip.

The thermal interface 202 comprises an insert 214, a first corrosion resistant layer 216, and a first organic layer 218. The insert 214 has a relatively smooth first side 214a and a patterned second side 214b and in one embodiment is formed in the manner described above with respect to the insert 114 illustrated in FIG. 1. The first corrosion resistant layer 216 comprises a layer of corrosion-resistant material coating the first side 214a of the insert 214, and the first organic layer 218 comprises a layer of organic material coating the first corrosion resistant layer 216. In one embodiment, the first corrosion resistant layer 216 and the first organic layer 218 are formed in the manner described above with respect to the corrosion resistant layer 116 and the organic layer 118 illustrated in FIG. 1.

In addition, the thermal interface 202 comprises a second corrosion resistant layer 220 and a second organic layer 222. The second corrosion resistant layer 220 comprises a layer of corrosion-resistant material coating the second side 214b of the insert 214, and the second organic layer 222 comprises a layer of organic material coating the second corrosion resistant layer 220. In one embodiment, the second corrosion resistant layer 220 and the second organic layer 222 are formed in the manner described above with respect to the first corrosion resistant layer 216 and the first organic layer 218.

During assembly of the heat generating device 204 to heat sink 206, the thermal interface 202 (i.e., the insert 214, first corrosion resistant layer 216, first organic layer 218, second corrosion resistant layer 220, and second organic layer 222) is compressed between the heat generating device 204 and the heat sink 206. The thermal interface 202 can thus be used to form a corrosion resistant interface between two oxide covered solids (e.g., silicon, refractory metals, oxide-covered copper heat sinks, etc.).

Figure 3:
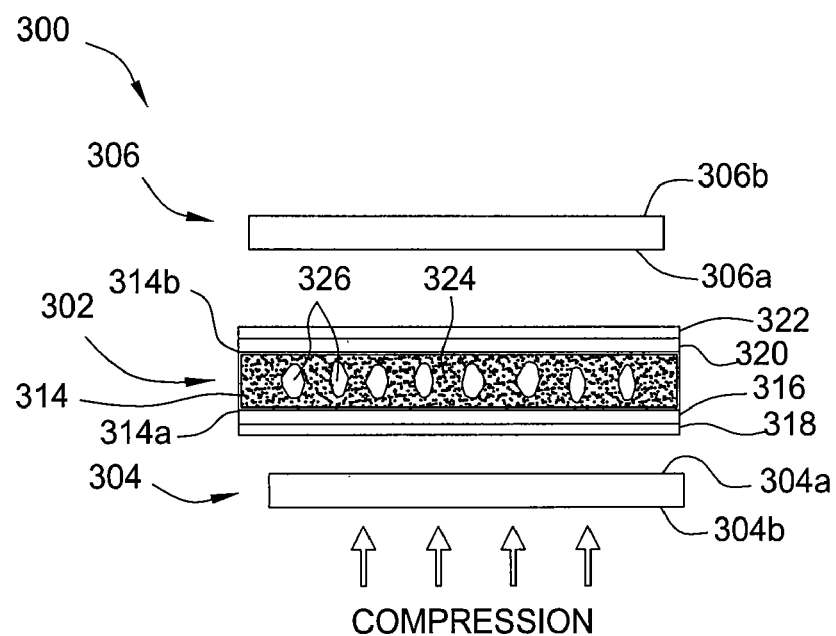
FIG. 3 is an exploded view of a heat sink assembly using a patterned metal thermal interface, according to a third embodiment of the present invention.

FIG. 3 is an exploded view of a heat sink assembly 300 using a patterned metal thermal interface 302, according to a third embodiment of the present invention.

The heat sink assembly 300 is substantially similar to the heat sink assemblies 100 and 200 illustrated in FIGS. 1 and 2 and comprises the thermal interface 302 disposed between a heat generating device 304 (e.g., a microprocessor chip or a lidded chip) and a heat sink 306. Alternatively, the heat sink 306 may be a lid where the heat generating device 304 is a microprocessor or semiconductor chip.

The heat sink 306 comprises at least a first surface 306a and a second surface 306b. In one embodiment, the heat sink 306 comprises at least one of: a vapor chamber, a heat pipe or a liquid cooler. The first surface 306a of the heat sink 306 is relatively flat and is configured to contact the thermal interface 302.

The heat generating device 304 also comprises a first surface 304a and a second surface 304b. In one embodiment, both the first surface 304a and the second surface 304b of the heat generating device 304 are relatively flat. In one embodiment, the heat generating device 304 is a silicon microprocessor chip.

The thermal interface 302 comprises an insert 314, a first corrosion resistant layer 316, a second corrosion resistant layer 320, a first organic layer 318, and a second organic layer 322. The insert 314 has a first side 314a and a second side 314b, both of which are relatively smooth. However, the interior volume 324 of the insert 314 is patterned in the form of compressible inclusions 326, which add elasticity to the insert 314 and may be regularly or randomly placed. In one embodiment, the inclusions 326 comprise at least one of: a gas (e.g., air or inert gas such as nitrogen or argon), a polymer (e.g., latex spheres), a small shell (e.g., a metal shell) filled with a gas and/or a polymer, or a rubber-like material (e.g., a woven or random fiber or mesh).

The first corrosion resistant layer 316 comprises a layer of corrosion-resistant material coating the first side 314a of the insert 314, and the first organic layer 318 comprises a layer of organic material coating the first corrosion resistant layer 316. The second corrosion resistant layer 320 comprises a layer of corrosion-resistant material coating the second side 314b of the insert 314, and the second organic layer 322 comprises a layer of organic material coating the second corrosion resistant layer 320. In one embodiment, the first corrosion resistant layer 316, the second corrosion resistant layer 320, the first organic layer 318, and the second organic layer 322 are formed in the manner described above with respect to the corrosion resistant layer 116 and the organic layer 118 illustrated in FIG. 1.

During assembly of the heat generating device 304 to heat sink 306, the thermal interface 302 (i.e., the insert 314, first corrosion resistant layer 316, first organic layer 318, second corrosion resistant layer 320, and second organic layer 322) is compressed between the heat generating device 304 and the heat sink 306. The inclusions 326 in the patterned interior volume 324 of the insert 314 are compressed, reducing the volume of the inclusions 326. The soft metal of the insert 314 is forced to move around the inclusions 326, creating local variations of the pressure on the heat generating device 304 and the heat sink 306. The local variations in pressure promote small deformations of the soft metal of the insert 314, in order to accommodate for non-perfect flatness of the heat generating device 304 and the heat sink 306. The inclusions also give an elastic property to the thermal interface 302. This allows the thermal interface 302 to deform in both directions (i.e., compression and expansion) in order to accommodate for small relative motions between the heat generating device 304 and the heat sink 306, particularly if the heat generating device 304 and the heat sink 306 move slightly apart as the result of thermal motions.

Figure 4:
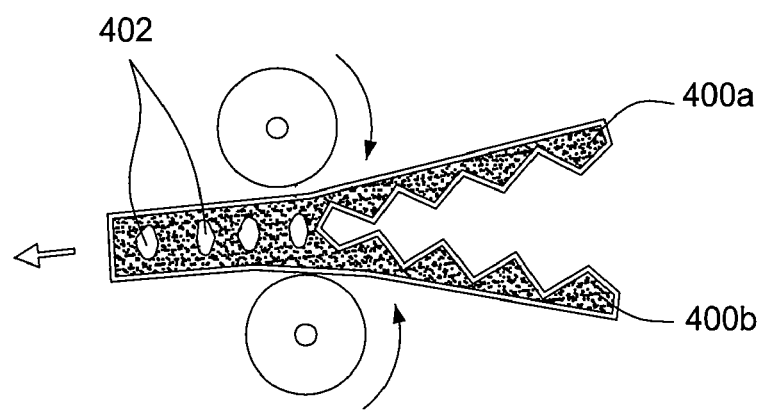
FIG. 4 is a schematic diagram illustrating one embodiment of a method for forming the insert illustrated in FIG. 3.

FIG. 4 is a schematic diagram illustrating one embodiment of a method for forming the insert 314 illustrated in FIG. 3. In the embodiment illustrated in FIG. 4, a first insert 400a and a second insert 400b are rolled together. In one embodiment, the first insert 400a and the second insert 400b are each patterned on one side and smooth on one side, similar to the patterned insert 102 illustrated in FIG. 1. In this case, the first insert 400a and the second insert 400b are positioned so that their patterned sides face each other and then rolled together. Air (or other materials) trapped between the patterned surfaces forms inclusions 402 in the middle of the first insert 400a and the second insert 400b.

Figure 5:
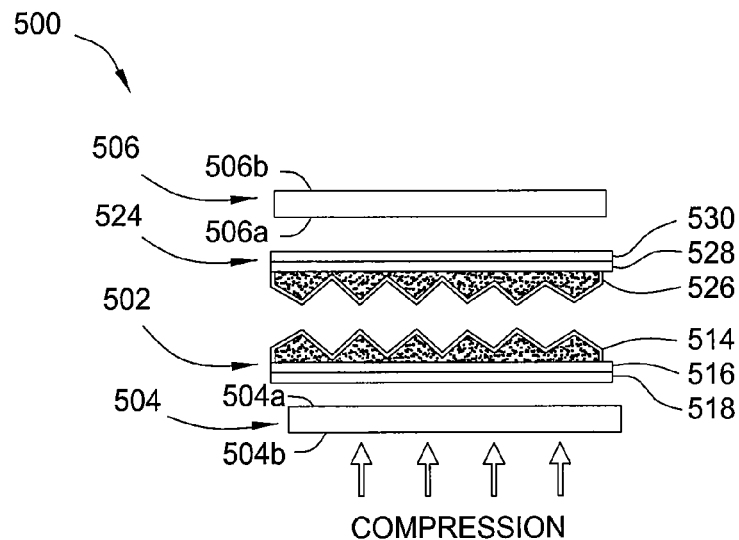
FIG. 5 is an exploded view of a heat sink assembly using a patterned metal thermal interface, according to a fourth embodiment of the present invention.

FIG. 5 is an exploded view of a heat sink assembly 500 using a patterned metal thermal interface 502, according to a fourth embodiment of the present invention.

The heat sink assembly 500 is substantially similar to the heat sink assemblies 100-300 illustrated in FIGS. 1-3 and comprises a first thermal interface 502 and a second thermal interface 524 disposed between a heat generating device 504 (e.g., a microprocessor chip or a lidded chip) and a heat sink 506. Alternatively, the heat sink 506 may be a lid where the heat generating device 504 is a microprocessor or semiconductor chip.

The heat sink 506 comprises at least a first surface 506a and a second surface 506b. In one embodiment, the heat sink 506 comprises at least one of: a vapor chamber, a heat pipe or a liquid cooler. The first surface 506a of the heat sink 506 is relatively flat and is configured to contact the second thermal interface 524.

The heat generating device 504 also comprises a first surface 504a and a second surface 504b. In one embodiment, both the first surface 504a and the second surface 504b of the heat generating device 504 are relatively flat. In one embodiment, the heat generating device 504 is a silicon microprocessor chip.

Each of the first thermal interface 502 and the second thermal interface 524 is configured in a manner substantially similar to the insert 114 illustrated in FIG. 1 and comprises an insert 514 or 526 (respectively), a corrosion resistant layer 516 or 528 (respectively), and an organic layer 518 or 530 (respectively).

During assembly of the heat generating device 504 to heat sink 506, the first thermal interface 502 (i.e., the insert 514, the corrosion resistant layer 516, and the organic layer 518) and the second thermal interface 524 (i.e., the insert 526, the corrosion resistant layer 528, and the organic layer 530) are compressed between the heat generating device 504 and the heat sink 506. Good performance is obtained by establishing full bonds between the heat generating device 504 and the metallic corrosion resistant later 516 of the first thermal interface 502 (i.e., via the organic layer 518) and between the between the heat sink 506 and the metallic corrosion resistant later 528 of the second thermal interface 524 (i.e., via the organic layer 530). Moreover, cost is mitigated by using two instances of the same thermal interface (i.e., first thermal interface 502 and second thermal interface 524).

Figure 6:
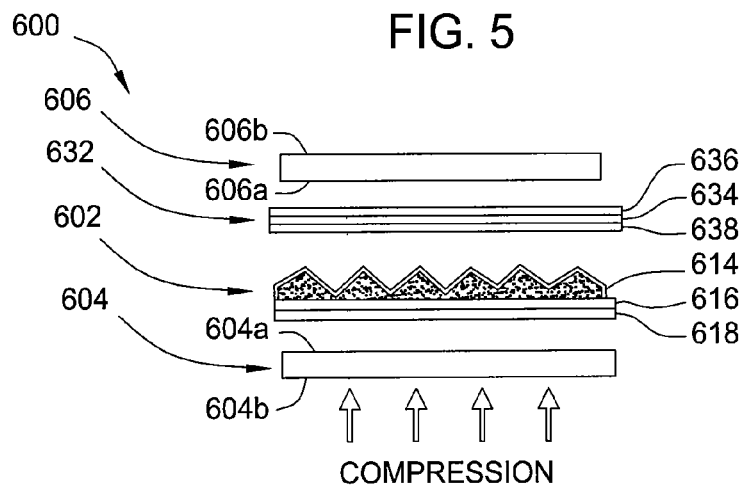
FIG. 6 is an exploded view of a heat sink assembly using a patterned metal thermal interface, according to a fifth embodiment of the present invention.

FIG. 6 is an exploded view of a heat sink assembly 600 using a patterned metal thermal interface 602, according to a fifth embodiment of the present invention.

The heat sink assembly 600 is substantially similar to the heat sink assembly 100 illustrated in FIG. 1 and comprises a thermal interface 602 disposed between a heat generating device 604 (e.g., a microprocessor chip or a lidded chip) and a heat sink 606. Alternatively, the heat sink 606 may be a lid where the heat generating device 604 is a microprocessor or semiconductor chip. Additionally, the assembly 600 comprises a supplemental insert 632 disposed between the thermal interface 602 and the heat sink 606.

The heat sink 606 comprises at least a first surface 606a and a second surface 606b. In one embodiment, the heat sink 606 comprises at least one of: a vapor chamber, a heat pipe or a liquid cooler. The first surface 606a of the heat sink 606 is relatively flat and is configured to contact the supplemental insert 632.

The heat generating device 604 also comprises a first surface 604a and a second surface 604b. In one embodiment, both the first surface 604a and the second surface 604b of the heat generating device 604 are relatively flat. In one embodiment, the heat generating device 604 is a silicon microprocessor chip.

The thermal interface 602 is configured in a manner substantially similar to the insert 114 illustrated in FIG. 1 and comprises an insert 614, a corrosion resistant layer 616, and a first organic layer 618.

The supplemental insert 632 comprises a relatively smooth core 634, a second organic layer 636 coating one side of the core 634, and a wetting layer 638 coating an opposite side of the core 634. The core 634 is thus "sandwiched" between the second organic layer 636 and the wetting layer 638. In one embodiment, the core 634 comprises a semi-rigid material, such as at least one of: nickel or aluminum. In one embodiment, the core 634 is approximately one to ten microns thick. In one embodiment, the second organic layer 636 is formed in the manner described above (e.g., from an adhesive, epoxy, oil, wax, etc.). In one embodiment, the second organic layer 636 is approximately 0.03 to 0.3 microns thick. In one embodiment, the wetting layer 638 is formed in the manner described above for the corrosion resistant layer 616 (e.g., from nickel, gold, a noble metal, etc.). In one embodiment, the wetting layer 638 is approximately 0.01 to 0.1 microns thick.

During assembly of the heat generating device 604 to heat sink 606, the thermal interface 602 (i.e., the insert 614, the corrosion resistant layer 616, and the organic layer 618) is compressed between the heat generating device 604 and supplemental insert 632 (i.e., the core 634, second organic layer 636, and wetting layer 638), while the supplemental insert 632 is compressed between the thermal interface 602 and the heat sink 606. The corrosion resistant wetting layer 638 of the supplemental insert 632 promotes inter-metallic bonding with the patterned soft metal of the thermal interface's insert 614. The second organic layer 636 of the supplemental insert 632 bonds to the first side 606a of the heat sink 606. Alternatively, the thermal interface 602 and supplemental insert 632 could be flipped so that the organic layer 618 of the thermal interface 602 bonds with the first side 606a of the heat sink 606, while the second organic layer 636 of the supplemental insert 632 bonds with the first side 604a of the heat generating device 604.

Figure 7:
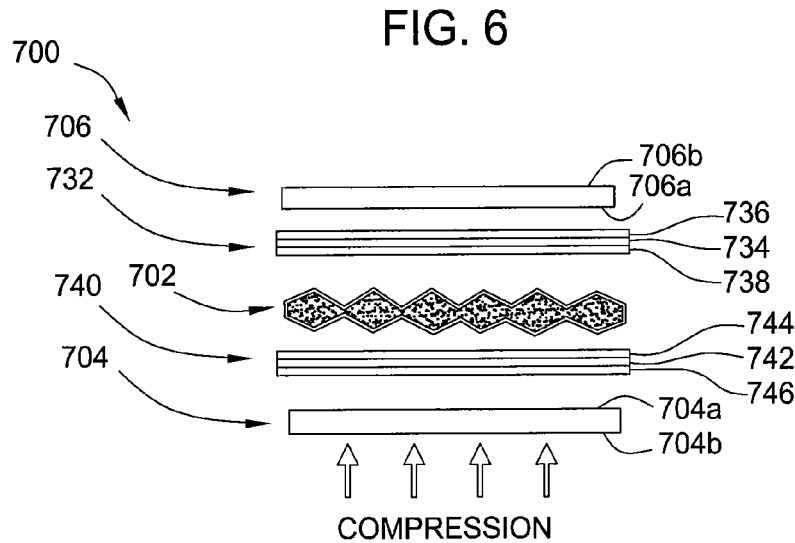
FIG. 7 is an exploded view of a heat sink assembly using a patterned metal thermal interface, according to a sixth embodiment of the present invention.

FIG. 7 is an exploded view of a heat sink assembly 700 using a patterned metal thermal interface 702, according to a sixth embodiment of the present invention.

The heat sink assembly 700 is substantially similar to the heat sink assembly 600 illustrated in FIG. 6 and comprises a thermal interface 702 disposed between a heat generating device 704 (e.g., a microprocessor chip or a lidded chip) and a heat sink 706. Alternatively, the heat sink 706 may be a lid where the heat generating device 704 is a microprocessor or semiconductor chip. Additionally, the assembly 700 comprises a first supplemental insert 732 disposed between the thermal interface 702 and the heat sink 706 and a second supplemental insert 740 disposed between the thermal interface 702 and the heat generating device 704.

The heat sink 706 comprises at least a first surface 706a and a second surface 706b. In one embodiment, the heat sink 706 comprises at least one of: a vapor chamber, a heat pipe or a liquid cooler. The first surface 706a of the heat sink 706 is relatively flat and is configured to contact the first supplemental insert 732.

The heat generating device 704 also comprises a first surface 704a and a second surface 704b. In one embodiment, both the first surface 704a and the second surface 704b of the heat generating device 704 are relatively flat. In one embodiment, the heat generating device 704 is a silicon microprocessor chip.

Unlike the thermal interfaces illustrated in the previous embodiments, the thermal interface 702 comprises simply a soft metal insert that is patterned on both sides. Each of the first supplemental insert 732 and the second supplemental insert 740 comprises a relatively smooth core 734 or 742 (respectively), a second organic layer 736 or 746 (respectively) coating one side of the core 734 or 742, and a wetting layer 738 or 744 (respectively) coating an opposite side of the core 734 or 742. Each of the first supplemental insert 732 and the second supplemental insert 740 is formed in a manner similar to the supplemental insert 632 discussed above with reference to FIG. 6.

During assembly of the heat generating device 704 to heat sink 706, the thermal interface 702 is compressed between the heat generating device 704 and the first supplemental insert 732 (i.e., the core 734, second organic layer 736, and second wetting layer 738). The thermal interface 702 is also compressed between the thermal the heat sink 706 and the second supplemental insert 740 (i.e., the core 742, second organic layer 746, and second wetting layer 744). The corrosion resistant wetting layers 738 and 744 of the first supplemental insert 732 and the second supplemental insert 740 promote intermetallic bonding with the patterned soft metal of the thermal interface. The second organic layers 736 and 746 of the first supplemental insert 732 and the second supplemental insert 740 bond to the first side 706a of the heat sink 706 and the first side 704a of the heat generating device 704.

Thus, a thermal interface is disclosed that provides improved heat transfer from a heat generating device to a heat sink, thereby allowing for better heat dissipation from the heat generating device. This ultimately results in better performance of the heat generating device, as heat-related failures are minimized.

While foregoing is directed to the preferred embodiment of the present invention, other and further embodiments of the invention may be devised without departing from the basic scope thereof, and the scope thereof is determined by the claims that follow.

The invention claimed is:

1. A thermal interface for coupling a first solid to a second solid, the thermal interface comprising:

a patterned metal insert having a first exterior side positioned to contact the first solid and a second exterior side positioned to contact the second solid;

a corrosion resistant layer coated directly onto at least one of the first exterior side and the second exterior side prior to the thermal interface being deployed between the first solid and the second solid, for protecting the patterned metal insert from corrosion, a metallic bond coupling the corrosion resistant layer to the patterned metal insert; and an organic layer coated directly onto the corrosion resistant layer prior to the thermal interface being deployed between the first solid and the second solid, for facilitating bonding of the patterned metal insert to one of the first solid and the second solid;

wherein the at least one of the first exterior side and the second exterior side that is coated by the corrosion resistant layer is unpatterned, and wherein an interior volume of the patterned metal insert is patterned.

2. The thermal interface of claim 1, wherein the patterned metal insert is patterned on one of the first exterior side and the second exterior side.

3. The thermal interface of claim 1, wherein the interior volume comprises a plurality of inclusions.

4. The thermal interface of claim 3, wherein the inclusions comprise at least one of: a gas, a polymer, a shell filled with a gas, a shell filled with a polymer, or a rubber-like material.

5. The thermal interface of claim 1, wherein the patterned metal insert comprises at least one of: a metal foil, a metal mesh, or a perforated metal sheet.

6. The thermal interface of claim 1, wherein the patterned metal insert comprises at least one of: indium, tin, indium-tin, lead, gold, silver, bismuth, antimony, thallium or gallium.

7. The thermal interface of claim 1, wherein the corrosion resistant layer comprises at least one of: titanium, tantalum, tungsten, nickel, gold, or platinum.

8. The thermal interface of claim 1, wherein the organic layer comprises at least one of: an adhesive, a polymer, an oil, a wax, or a paraffin.

9. The thermal interface of claim 1, wherein the first exterior side and the second exterior side define an outer boundary of the patterned metal insert.

10. The thermal interface of claim 1, wherein the patterned metal insert comprises an array of metal lumps held together by an organic binder.

11. The thermal interface of claim 1, wherein the patterned metal insert, the corrosion resistant layer, and the organic layer together comprise a unitary structure that is removable as a whole from between the first solid and the second solid.

12. The thermal interface of claim 1, wherein the corrosion resistant layer is formed from a material that is more noble than a material from which the patterned metal insert is formed.

13. A method for coupling a first solid to a second solid using a thermal interface, the method comprising:

positioning the thermal interface between a first surface of the first solid and a first surface of the second solid, the thermal interface comprising: a patterned metal insert having a first exterior side positioned to contact the first solid and a second exterior side positioned to contact the second solid;

metallic bonding a corrosion resistant layer coated directly onto at least one of the first exterior side and the second exterior side of the patterned metal insert prior to the positioning, for protecting the patterned metal insert from corrosion; and an organic layer coated directly onto the corrosion resistant layer prior to the positioning, for facilitating bonding of the patterned metal insert to one of the first solid and the second solid; and compressing the thermal interface between the first surface of the first solid and the first surface of the second solid such that the patterned metal insert deforms;

wherein the at least one of the first exterior side and the second exterior side that is coated by the corrosion resistant layer is unpatterned, and wherein an interior volume of the patterned metal insert is patterned.

14. The method of claim 13, wherein the first solid is a heat generating device, and the second solid is a heat sink.

15. The method of claim 13, wherein the patterned metal insert, the corrosion resistant layer, and the organic layer are pre-assembled as the thermal interface prior to the positioning.

* * * * *